US009086961B2

(12) United States Patent
Zhou

(10) Patent No.: US 9,086,961 B2
(45) Date of Patent: Jul. 21, 2015

(54) REPAIR METHOD AND DEVICE FOR ABNORMAL-ERASE MEMORY BLOCK OF NON-VOLATILE FLASH MEMORY

(71) Applicant: MStar Semiconductor, Inc., Hsinchu County (TW)

(72) Inventor: Tao Zhou, Shanghai (CN)

(73) Assignee: MSTAR SEMICONDUCTOR, INC., Hsinchu County (TW)

( * ) Notice: Subject to any disclaimer, the term of this patent is extended or adjusted under 35 U.S.C. 154(b) by 183 days.

(21) Appl. No.: 13/737,033

(22) Filed: Jan. 9, 2013

(65) Prior Publication Data

US 2013/0179728 A1 Jul. 11, 2013

(30) Foreign Application Priority Data

Jan. 9, 2012 (CN) .......................... 2012 1 0004631

(51) Int. Cl.
G06F 11/00 (2006.01)
G06F 11/07 (2006.01)
G11C 16/34 (2006.01)
G11C 29/00 (2006.01)
G11C 16/22 (2006.01)

(52) U.S. Cl.
CPC .......... G06F 11/0703 (2013.01); G11C 16/225 (2013.01); G11C 16/3445 (2013.01); G11C 29/00 (2013.01); G11C 29/82 (2013.01)

(58) Field of Classification Search
CPC ............ G06F 11/0703; G06F 11/0793; G11C 16/344; G11C 16/3445; G11C 29/00; G11C 29/82

USPC ........... 714/6.11, 15, 36, 42, 49, 54, 747, 819
See application file for complete search history.

(56) References Cited

U.S. PATENT DOCUMENTS

| 5,369,616 | A | * | 11/1994 | Wells et al. ............... 365/185.22 |
| 5,544,119 | A | * | 8/1996 | Wells et al. ............... 365/185.11 |
| 6,504,773 | B2 | * | 1/2003 | Kobayashi ..................... 365/201 |
| 6,715,106 | B1 | * | 3/2004 | Mermelstein ................... 714/36 |
| 7,117,402 | B2 | * | 10/2006 | Di Zenzo et al. ............. 714/716 |
| 7,328,302 | B2 | * | 2/2008 | Fischer et al. ................. 711/103 |
| 7,657,795 | B2 | * | 2/2010 | Fischer .......................... 714/42 |
| 8,006,030 | B2 | * | 8/2011 | Nakamura et al. ............ 711/103 |
| 2007/0183223 | A1 | * | 8/2007 | Aritome ..................... 365/185.29 |
| 2010/0228907 | A1 | * | 9/2010 | Shen ............................. 711/103 |
| 2010/0269000 | A1 | * | 10/2010 | Lee ............................... 714/718 |
| 2011/0041005 | A1 | * | 2/2011 | Selinger ........................... 714/6 |
| 2011/0041039 | A1 | * | 2/2011 | Harari et al. ................... 714/773 |
| 2011/0072198 | A1 | * | 3/2011 | Reiter et al. ................... 711/103 |
| 2011/0119442 | A1 | * | 5/2011 | Haines et al. ................. 711/113 |
| 2011/0138222 | A1 | * | 6/2011 | Haines et al. ................. 714/6.12 |
| 2012/0144249 | A1 | * | 6/2012 | Franceschini et al. .......... 714/54 |
| 2013/0336063 | A1 | * | 12/2013 | Kim .......................... 365/185.12 |

* cited by examiner

Primary Examiner — Marc Duncan
(74) Attorney, Agent, or Firm — WPAT, PC; Justin King

(57) ABSTRACT

A repair method for an abnormal-erase memory block of a non-volatile flash memory is provided. The method includes steps of: sequentially scanning bit data in a page of a block when reading data in a NAND flash; determining whether the page is an abnormal-erase page; setting logic "0" bit data in the page to logic "1" when the page is an abnormal-erase page; and re-erasing the block.

14 Claims, 4 Drawing Sheets

REPAIR METHOD AND DEVICE FOR ABNORMAL-ERASE MEMORY BLOCK OF NON-VOLATILE FLASH MEMORY

This application claims the benefit of People's Republic of China application Serial No. 201210004631.1, filed Jan. 9, 2012, the subject matter of which is incorporated herein by reference.

BACKGROUND OF THE INVENTION

1. Field of the Invention

The invention relates in general to a computer field, and more particularly to a repair method and device for an abnormal-erase memory block of a non-volatile flash memory.

2. Description of the Related Art

A non-volatile flash memory (e.g., a NAND flash), being advantaged by having a large capacity, a fast access speed and a low cost per unit capacity, is prevalent as a carrier for storing data in embedded devices.

Although offering the above advantages, the NAND flash nevertheless suffers from certain drawbacks. For example, a main drawback of the NAND flash is that the NAND flash has a less satisfactory reliability. To ensure intactness of user information, software is implemented to remedy the hardware insufficiency. With respect to the less satisfactory reliability of the NAND flash, bad blocks are a most critical issue that draws much attention.

In fact, erase, write and read operations of the NAND flash memory are similarly unreliable, and may also produce errors. However, probabilities of errors in erase, write and read operations are rather small and are frequently neglected. In the occurrence of errors in read and write operations, intactness of data remains undamaged as a result of protection provided by an error correcting code (ECC). A NAND flash is generally divided into memory blocks, each being divided into several pages. Read and write operations are performed based on a unit of pages. Each page is divided into a main region and a spare region. The main region is larger in size and stores user data; the spare region is smaller and stores the ECC. Only in a page storing user data in the main region, the ECC is calculated and stored in the spare region. Substantially, a write operation sets logic "1" bits in a to-be-written block to logic "0", whereas an erase operation conversely sets logic "0" bits in a to-be-erased block to logic "1". The ECC is not calculated in blank pages subsequent to the erased page, and the spare region maintains the status of all the logic "1" bits.

Assuming an erase operation is not protected by the ECC when an error occurs in the erase operation or when an erase process encounters an unexpected power-off, inexplicable situations are often caused if a system reads related information of the last erroneous erase operation. Not only user experience is degraded, but also catastrophic outcomes such as a system crash or a system standstill may be resulted. Therefore, there is a need for a solution that provides satisfactory reliability to an erase operation of the NAND flash.

SUMMARY OF THE INVENTION

The invention is directed to a repair method and device for an abnormal-erase memory block of a non-volatile flash memory, so the abnormal-erase memory block is scanned and repaired to prevent erroneous storage data that is caused by an unexpected power-off during a process of erasing the memory block.

A repair method for an abnormal-erase memory block of a non-volatile flash memory includes steps of: scanning bit data in a page of a to-be-read memory block having required data when reading data in a NAND flash; determining whether the page is an abnormal-erase page; setting-logic "0" bit data in the page to logic "1" when the page is an abnormal-erase page; and erasing the to-be-read block.

A repair device for an abnormal-erase memory block of a non-volatile flash memory includes: a scanning module, for scanning bit data in a page of a to-be-read block having required data when reading data in a NAND flash; a first determining module, for determining whether the page is an abnormal-erase page; a bit configuring module, for setting logic "0" bit data in the page to logic "1" when the page is an abnormal-erase page; and an erasing module, for erasing the to-be-read block.

Different from the prior art, when reading the data in the NAND flash according to the disclosure, the bit data in the page of the block having the required data are sequentially scanned, it is judged whether the page is an abnormal-erase page, the logic "0" bit data in the page are set to logic "1" when the page is an abnormal-erase page, and the block is then re-erased. Therefore, the disclosure is capable of completely repairing the abnormality resulted by an erase failure that has a small probability but may cause a severe outcome, so as to ensure abnormal data are not caused in the occurrence of a NAND flash erase failure and even an unexpected power-off, thereby allowing the system to stay functional and increasing the system reliability.

The above and other aspects of the invention will become better understood with regard to the following detailed description of the preferred but non-limiting embodiments. The following description is made with reference to the accompanying drawings.

DETAILED DESCRIPTION OF THE INVENTION

Figure 1:
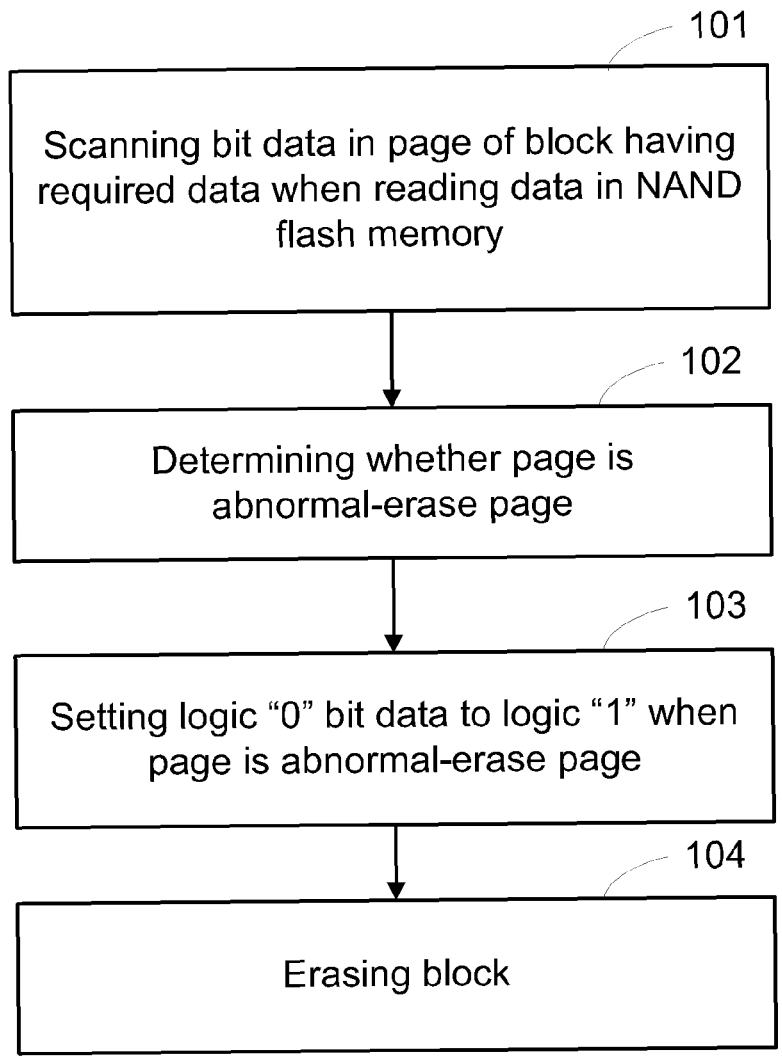
FIG. 1 is a flowchart of a repair method for an abnormal-erase memory block of a non-volatile flash memory according to a first embodiment of the disclosure.

FIG. 1 shows a flowchart of a repair method for an abnormal-erase memory block of a non-volatile memory according to a first embodiment of the disclosure.

In Step 101, when reading data in a NAND flash, bit data in a page of a to-be-read block having required data are sequentially scanned. After one unsuccessful erase operation, when an unexpected power-off occurs before any remedial measures are taken, a specific location of the data in the NAND flash before the abnormal erase operation should first be scanned in a next system boot. Therefore, in each system boot, the data in the NAND flash are scanned to first identify and repair the abnormal-erase memory block. Thus, when reading the data in the NAND flash, the bit data in the page of the to-be-read block having the required data are sequentially scanned.

In Step 102, it is determined whether the page is an abnormal-erase page. An abnormal-erase page refers to a page that is not completely erased, and logic "0" bit data are not set to logic "1". Since a spare region is for storing an ECC, if the ECC in the spare region is not erased while an error occurs in the data in a main region, the ECC in the spare region resultantly contains an error in the abnormal-erase page. However, in another type of abnormal-erase page, the ECC in the spare region is already erased whereas the data in the main region is not erased, the situation of such type of abnormal-erase page is less obvious and not easily discovered.

Therefore, to determine whether the page is an abnormal-erase page, particularly to determine whether the page is an abnormal-erase page of the less obvious situation, when the ECC in the spare region is erased and the data in the main region is not yet completely erased, it is determined that the page is an abnormal-erase page.

In Step 103, when it is determined in Step 102 that the page is an abnormal-erase page, logic "0" bit data in the page are set to logic "1", followed by performing Step 104.

In Step 104, the to-be-read block is re-erased. After re-erasing the to-be-read block, status information of the NAND flash is read again. When it is learned from the status information of the NAND flash that the current erase operation is still unsuccessful, the repair process is continued by iterating the re-erasing process until the erase operation is successful.

In this embodiment, when reading the data in the NAND flash, the bit data in the page of the to-be-read block having the required data are sequentially scanned. It is then determined whether the page is an abnormal-erase page. When the page is an abnormal-erase page, the logic "0" bit data in the page are set to logic "1", and the to-be-read block is re-erased. Therefore, this embodiment is capable of completely repairing the abnormality resulted by an erase failure that has a small probability but may cause a severe outcome, so as to ensure abnormal data are not caused in the occurrence of a NAND flash erase failure and even an unexpected power-off, thereby allowing the system to stay functional and increasing the system reliability.

The NAND flash usually has a large capacity. If all the data in the NAND flash are checked for each system boot, overall efficiency is rather non-ideal and a boot speed is also undesirably affected. Therefore, it is an object of a second embodiment of the disclosure to enhance the scanning process of a boot procedure by well-implementing regular patterns of the abnormal erase operation.

Figure 2:
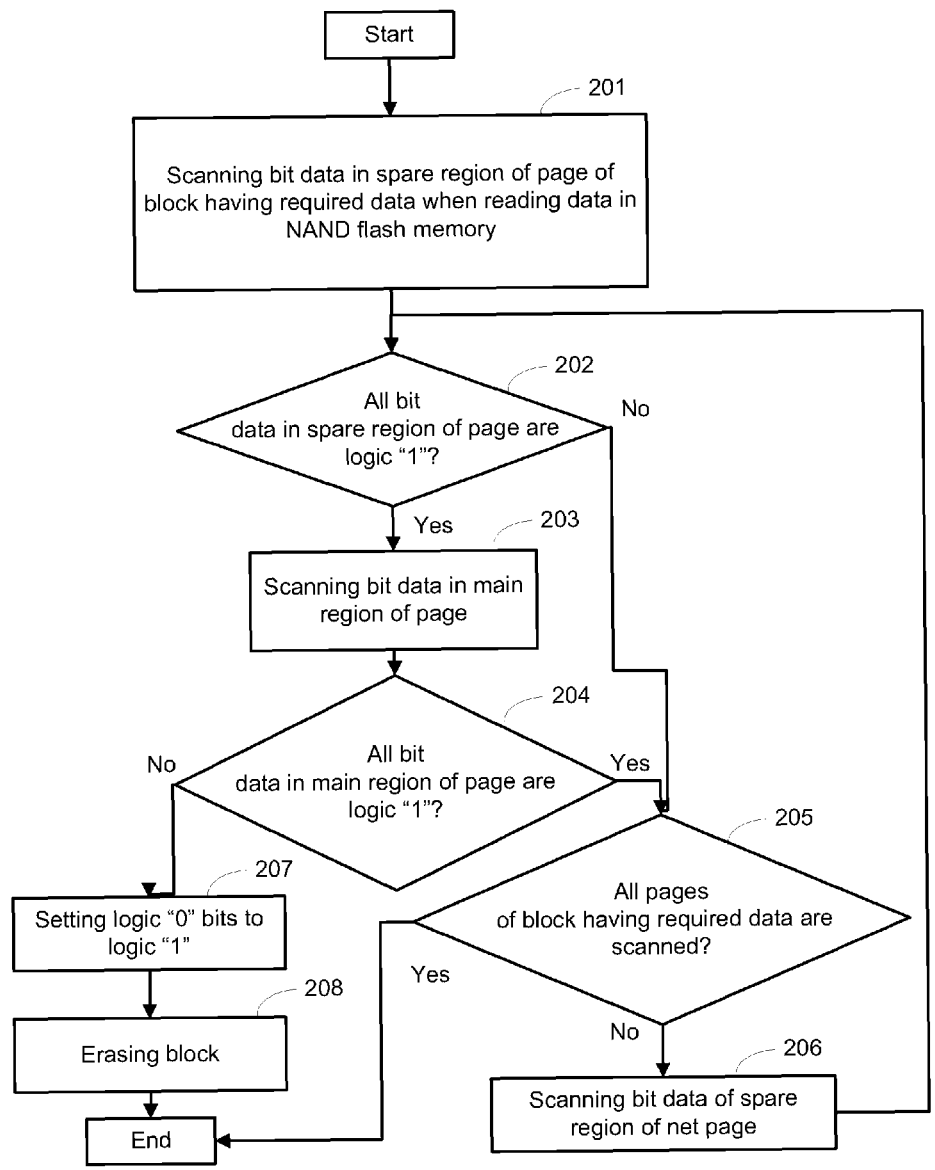
FIG. 2 is a flowchart of a repair method for an abnormal-erase memory block of a non-volatile flash memory according to a second embodiment of the disclosure.

FIG. 2 shows a repair method for an abnormal-erase memory block of a non-volatile flash memory according to the second embodiment of the disclosure.

Referring to FIG. 2, in Step 201, when reading data in a NAND flash, bit data in a spare region of a page of a to-be-read block having required data are sequentially scanned. After one unsuccessful erase operation, when an unexpected power-off occurs before any remedial measures are taken, a specific location of the data in the NAND flash before the abnormal erase operation should first be scanned in a next system boot. Therefore, in each system boot, the data in the NAND flash are scanned to first identify and repair the abnormal-erase memory block.

Thus, when reading the data in the NAND flash, the bit data in the spare region of the page of the to-be-read block having the required data are sequentially scanned. Each page is divided into the main region and the spare region. The main region is larger in size and stores user data; the spare region is smaller generally in a size of 16-bytes or 64-bytes, and stores the ECC. Only in a page storing user data in the main region, the ECC is calculated and stored in the spare region. The ECC is not calculated in blank pages subsequent to the erased page, and the spare region maintains the status of all the logic "1" bits.

Further, for a page stored with data, last several bytes in the spare region are not hexadecimal 0xFF. Hence, the spare region is scanned backwards when scanning the spare region, so that for most pages stored with data, other data are not further checked after having learned that the last byte is not 0xFF, thereby significantly accelerating the scanning speed.

In Step 202, it is determined whether all the bit data in the spare region are logic "1". When it is determined that not all bit data in the spare region are logic "1", it is concluded that the spare region contains the ECC. If the spare region contains erroneous data, the ECC is also erroneous. Therefore, when it is determined that not all bit data in the spare region are logic "1", it is concluded that the page is not completed erased. Such page does not need to be further checked, meaning that no additional large amount of time is required for scanning the larger main region, and so Step 205 is performed. When it is determined that all bit data in the spare region are logic "1", it is concluded that the page is completely erased. Such page needs to be further checked, and so Step 203 is performed.

In Step 203, bit data in the main region of the page are scanned. After determining that all the bit data in the spare region of the page are logic "1", the main region of the page is scanned.

In Step 204, it is determined whether all bit data in the main region are logic "1". When scanning the main region, the bytes are sequentially checked to determine whether all the bit data in the main region are logic "1". When all the bit data are logic "1", it is concluded that the page erase operation is successful and no erroneous bit data are present, and so Step 205 is performed. When not all the bit data are logic "1", it is concluded that the page erase operation is failed, and so Step 207 is performed.

In Step 205, it is determined whether all pages of the to-be-read block having the required data are scanned. When it is determined in Step 202 that not all the bit data in the spare region of the page are logic "1", or when it is determined in Step 204 that all the bit data in the main region of the page are logic "1", it is then determined whether all the page of the to-be-read block having the required data are scanned. When not all the pages of the to-be-read block having the required data are scanned, Step 206 is performed to continue scanning a next page, or else the flow ends.

In Step 206, the bit data in the spare region of the next page are scanned. When it is determined in Step 205 that not all the pages of the to-be-read block having the required data are scanned, the bit data in the spare region of the next page are scanned, and Step 202 is iterated.

In Step 207, the logic "0" bits are set to logic "1". When it is determined in Step 204 that not all the bit data in the main region of the page are logic "1", i.e., some of the bit data are logic "0", it is concluded that the page erase operation is failed, and the page needs to be repaired, i.e., the logic "0" bits are set to logic "1".

In Step 208, the to-be-read block is erased. After setting the logic "0" bits to logic "1" in Step 207, the block containing the page is re-erased. After re-erasing the block, the status information of the NAND flash is read again. When it is learned from the status information of the NAND flash that this erase operation is still unsuccessful, the repair process is continued by iterating the re-erasing process until the erase operation is successful.

Figure 3:
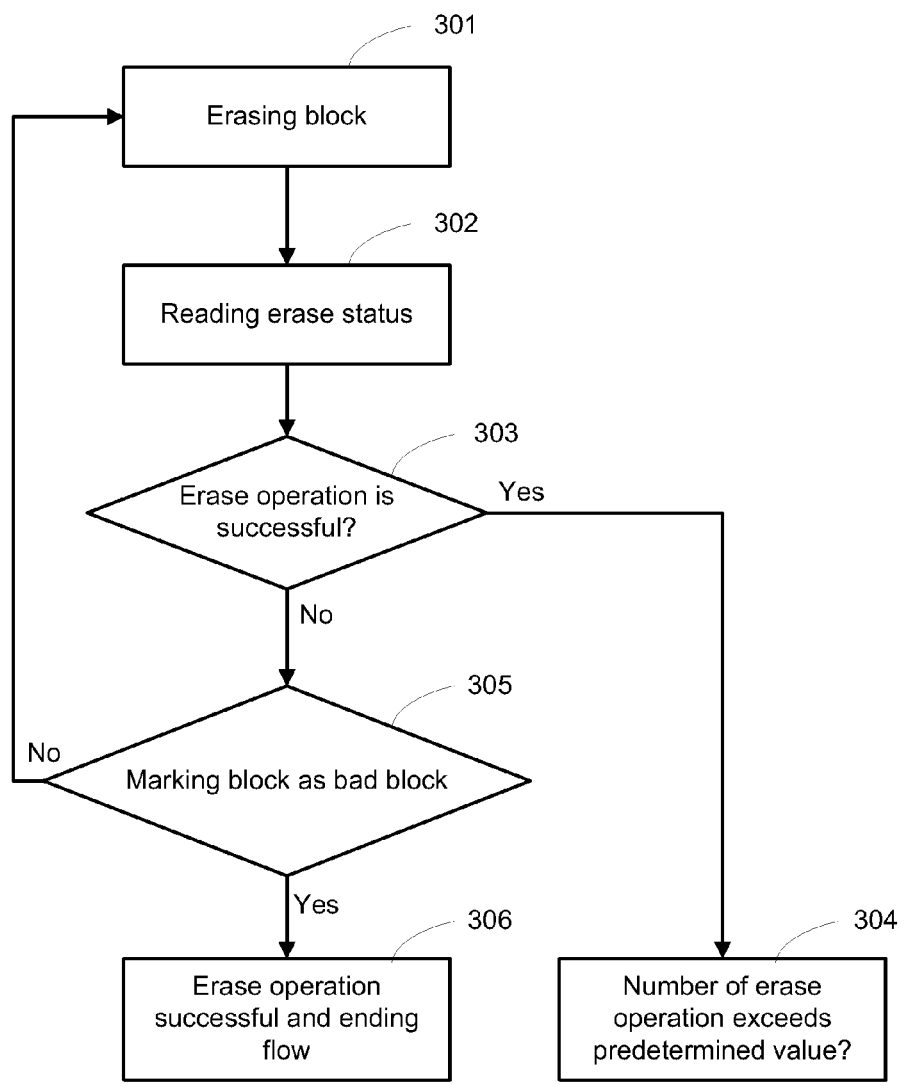
FIG. 3 is a flowchart of erasing a block according to an embodiment of the disclosure.

FIG. 3 shows a flowchart of erasing a block according to an embodiment of the disclosure.

In Step 301, the block is erased.

In Step 302, an erase status is read. After erasing the block, the erase status is read, following by performing Step 303.

In Step 303, it is determined whether the erase operation is successful. According to the erase status in Step 302, it is determined whether the erase operation is successful. Step 304 is performed when the erase operation is successful, or else Step 305 is performed when the erase operation is unsuccessful.

In Step 304, the flow ends when the erase operation is successful.

In Step 305, it is determined whether a number of the erase operation exceeds a predetermined value when the erase operation is unsuccessful. When it is determined in Step 303 that the erase operation is unsuccessful according to the erase status, it is again determined whether the number of the erase operation exceeds the predetermined value. Step 306 is performed when the number of the erase operation exceeds the predetermined value, or else the erase operation on the block is continued until the erase operation is successful or until the number of the erase operation exceeds the predetermined value.

In Step 306, when the number of the erase operation exceeds the predetermined value, the block is marked as a bad block. When the number of the erase operation exceeds the predetermined value, it is concluded that the block is damaged, and the block is thus marked as a bad block.

In this embodiment, when reading the data in the NAND flash, the bit data in the page of the to-be-read block having the required data are scanned, beginning by the scanning the spare region of the page. When it is scanned that all the bit data in the spare region of the page are logic "1", the bit data in the main region are next scanned and determined. When it is determined that not all the bit data in the spare region of the page are logic "1", the page and the block containing the page are repaired. Therefore, this embodiment is capable of completely repairing the abnormality resulted by an erase failure that has a small probability but may cause a severe outcome, so as to ensure abnormal data are not caused in the occurrence of a NAND flash erase failure and even an unexpected power-off, thereby allowing the system to stay functional and increasing the system reliability. Further, by enhancing the scanning process, the scanning speed as well as efficiency is increased.

Figure 4:
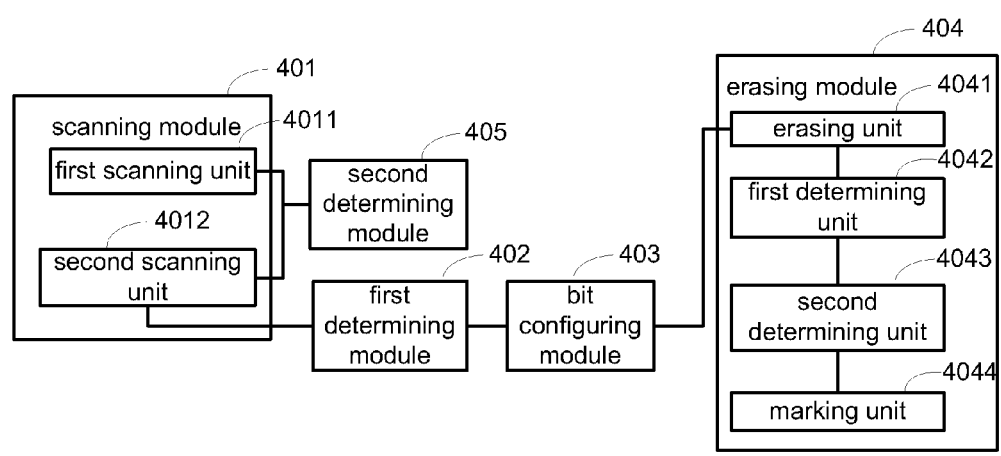
FIG. 4 is block diagram of a repair device for an abnormal-erase memory block of a non-volatile flash memory according to an embodiment of the disclosure.

FIG. 4 shows a repair device for an abnormal-erase memory block of a non-volatile flash memory according to one embodiment of the disclosure.

The repair device includes: a scanning module 401, for scanning bit data of a page of a to-be-read block having required data when reading data in a NAND flash; a first determining module 402, coupled to the scanning module 401, for determining whether the page is an abnormal-erase page; a bit configuring module 403, coupled to the first determining module 402, for setting logic "0" bit data in the page to logic "1" when the first determining module 402 determines that the page is an abnormal-erase page; and an erasing module 404, coupled to the bit configuring module 403, for erasing the to-be-read block.

The repairing device according to this embodiment further includes a second determining module 405. The second determining module 405 is coupled to the scanning module 401, and is for determining whether all bit data in a spare region are logic "1".

Further, the scanning module 401 includes: a first scanning unit 4011, for scanning the bit data in the spare region of the page; a second scanning unit 4012, for scanning bit data in a main region of the page when the second determining module 405 determines that all the bit data in the spare region are logic "1". Wherein, the first scanning unit 4011 scans forwards from an end of the spare region when performing scanning.

Further, the erasing module 404 includes: an erasing unit 4041, for erasing the to-be-read block; a first determining unit 4042, coupled to the erasing unit 4041, for determining whether the erase operation is successful; a second determining unit 4043, for determining whether a number of the erase operation exceeds a predetermined value when the first determining module 4042 determines that the erase operation is unsuccessful; and a marking unit 4044, coupled to the second determining unit 4043, for marking the block as a bad block when the second determining unit 4043 determines that the number of the erase operation exceeds the predetermined value.

In this embodiment, when reading the data in the NAND flash, the bit data in the page of the to-be-read block having the required data are scanned, beginning by the scanning the spare region of the page. When it is scanned that all the bit data in the spare region of the page are logic "1", the bit data in the main region are next scanned and determined. When it is determined that not all the bit data in the spare region of the page are logic "1", the page and the block containing the page are repaired. Therefore, this embodiment is capable of completely repairing the abnormality resulted by an erase failure that has a small probability but may cause a severe outcome, so as to ensure abnormal data are not caused in the occurrence of a NAND flash erase failure and even an unexpected power-off, thereby allowing the system to stay functional and increasing the system reliability. Further, by enhancing the scanning process, the scanning speed as well as efficiency is increased.

While the invention has been described by way of example and in terms of the preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method for repairing an abnormal-erase memory block of a non-volatile flash memory, comprising:
    scanning bit data in a first to-be-read page of a block, wherein said block comprises said first to-be-read page and a second to-be-read page;
    determining whether the first page is in an abnormal-erase status; and
    setting bits in the first page from logic "0" to logic "1", and then erasing both the first to-be-read page and the second to-be-read page when the first page is in the abnormal-erase status;
    wherein, the second to-be-read page is un-scanned.

2. The method according to claim 1, wherein the step of scanning the bit data in the first to-be-read page scans by beginning with a spare region of the first to-be-read page.

3. The method according to claim 2, wherein the step of scanning by beginning with the spare region of the first to-be-read page scans forwards from an end of the spare region.

4. The method according to claim 3, after the step of scanning by beginning with the spare region of the first to-be-read page, further comprising:
    determining whether all the bit data in the spare region of the first to-be-read page are logic "1"; and
    when all the bit data in the spare region of the first to-be-read page are logic "1", scanning bit data in a main region of the first to-be-read page, and performing the step of determining whether the first to-be-read page is an abnormal-erase page.

5. The method according to claim 4, after the step of determining whether all the bit data in the spare region of the first page are logic "1", further comprising:
when not all the bit data in the spare region of the first to-be-read page are logic "1", continuing scanning the bit data in a spare region of a next page until all pages of the block are scanned.

6. The method according to claim 5, wherein the step of determining whether the first page is in the abnormal-erase status comprises:
determining whether all the bit data in the main region of the first to-be-read page are logic "1";
determining the page is the abnormal-erase page when not all the bit data in the main region of the first to-be-read page are logic "1"; and
determining the page is not the abnormal-erase page when all the bit data in the main region of the first to-be-read page are logic "1".

7. The method according to claim 6, after the step of determining whether the page is in the abnormal-erase status, further comprising:
when the first to-be-read page is not the abnormal-erase page, continuing scanning the bit data in the spare region of the next page until all the pages of the block are scanned.

8. The method according to claim 7, wherein the step of erasing both the first to-be-read page and the second page comprises:
performing an erase operation on the block;
determining whether the erase operation is successful;
determining whether a number of erase operation exceeds a predetermined value when the erase operation is unsuccessful; and
marking the block as a bad block when the number of erase operation exceeds the predetermined value.

9. The method according to claim 8, after the step of determining whether the number of erase operation exceeds the predetermined value, further comprising:
when the number of erase operation does not exceed the predetermined value, continuing performing the step of erasing the block until the erase operation is successful or the number of erase operation exceeds the predetermined value.

10. A device for repairing an abnormal-erase memory block of a non-volatile memory, comprising:
a scanning module, for scanning bit data in a first page of a block when reading data in a non-volatile flash memory, wherein said block comprises said first to-be-read page and a second to-be-read page;
a first determining module, coupled to the scanning module, for determining whether the first to-be-read page is in the abnormal-erase status;
a bit configuring module, coupled to the first determining module, for setting bits from the first page from logic "0" to logic "1"when the first to-be-read page is in the abnormal-erase status; and
an erasing module, coupled to the bit configuring module, for erasing the block;
wherein, said to-be-read second page is un-scanned.

11. The device according to claim 10, further comprising:
a second determining module, coupled to the scanning module, for determining whether all bit data in a spare region of the first page are logic "1".

12. The device according to claim 11, wherein the scanning module comprises:
a first scanning unit, for scanning the bit data in the spare region of the first to-be-read page; and
a second scanning unit, for scanning bit data in a main region of the first to-be-read page when the second determining module determines that all the bit data in the spare region are logic "1".

13. The device according to claim 12, wherein the first scanning module scans forwards from an end of the spare region when performing scanning.

14. The device according to claim 13, wherein the erasing module comprises:
an erasing unit, for performing an erase operation on the block;
a first determining unit, coupled to the erasing unit, for determining whether the erase operation is successful;
a second determining unit, for determining whether a number of erase operation exceeds a predetermined value when the first determining module determines that the erase operation is unsuccessful; and
a marking unit, coupled to the second determining unit, for marking the block as a bad block when the second determining unit determines that the number of erase operation exceeds the predetermined value.

* * * * *